(12) United States Patent
Hayashi et al.

(10) Patent No.: US 9,005,466 B2
(45) Date of Patent: Apr. 14, 2015

(54) HIGHLY INSULATIVE AND HIGHLY STABLE PIEZOELECTRIC SINGLE LTGA CRYSTAL, METHOD FOR PRODUCING THE SAME, PIEZOELECTRIC ELEMENT USING SAID SINGLE LTGA CRYSTAL, AND COMBUSTION PRESSURE SENSOR

(75) Inventors: Takayuki Hayashi, Nagano (JP);
Toshimitsu Aruga, Nagano (JP);
Makoto Matsukura, Hokuto (JP);
Yutaka Anzai, Hokuto (JP); Akio Miyamoto, Hokuto (JP); Sadao Matsumura, Hokuto (JP); Yasunori Furukawa, Hokuto (JP)

(73) Assignee: Citizen Finetech Miyota Co., Ltd., Nagano (JP)

( * ) Notice: Subject to any disclaimer, the term of this patent is extended or adjusted under 35 U.S.C. 154(b) by 48 days.

(21) Appl. No.: 13/583,600

(22) PCT Filed: Mar. 9, 2011

(86) PCT No.: PCT/JP2011/056123
§ 371 (c)(1),
(2), (4) Date: Sep. 7, 2012

(87) PCT Pub. No.: WO2011/111859
PCT Pub. Date: Sep. 15, 2011

(65) Prior Publication Data
US 2013/0015393 A1    Jan. 17, 2013

(51) Int. Cl.
| | |
|---|---|
| C30B 29/30 | (2006.01) |
| C30B 33/02 | (2006.01) |
| H01L 41/08 | (2006.01) |
| H01L 41/18 | (2006.01) |
| C30B 29/22 | (2006.01) |
| G01L 9/08 | (2006.01) |
| G01L 23/10 | (2006.01) |
| H01L 41/113 | (2006.01) |
| H01L 41/187 | (2006.01) |
| C30B 15/00 | (2006.01) |
| H01L 41/41 | (2013.01) |
| F02D 35/02 | (2006.01) |

(52) U.S. Cl.
CPC . C30B 29/22 (2013.01); G01L 9/08 (2013.01); G01L 23/10 (2013.01); H01L 41/1132 (2013.01); H01L 41/187 (2013.01); C30B 15/00 (2013.01); C30B 33/02 (2013.01); H01L 41/41 (2013.01); F02D 35/023 (2013.01)

(58) Field of Classification Search
USPC ............ 117/949, 36; 252/62.9 R; 310/311; 73/144.18, 35.13
See application file for complete search history.

(56) References Cited

U.S. PATENT DOCUMENTS

| 6,303,048 B1 | 10/2001 | Kawanaka et al. |
| 2008/0081013 A1 | 4/2008 | Fududa et al. |

FOREIGN PATENT DOCUMENTS

| JP | 11-322495 A | 11/1999 |
| JP | 2002-220298 | 8/2002 |
| JP | 2006-250916 | 9/2006 |
| JP | 2007-131470 | 5/2007 |
| JP | 2007-238417 | 9/2007 |
| JP | 2010-24071 | 2/2010 |
| WO | WO 2006/106875 | 10/2006 |

OTHER PUBLICATIONS

European Patent Office, "Supplementary European Search Report," Jun. 28, 2013, 7 pp., Application No. EP 11 75 3514.
Takeda, H. at al., "Effective Substitution of Aluminum for Gallium in Langasite-Type Crystals for a Pressure Sensor Use at High Temperature," 2005, pp. 560-563, vol. 1, IEEE Ultrasonics Symposium 2005 Institute of Electrical and Electronics Engineers, Inc.
Sakharov et al., "Physical Properties of Lanthanum Gallium Tantalate Crystals for High-Temperature Application", 2005 IEEE, Ultrasonics Symposium, 4 pages.
International Search Report from the Japanese Patent Office, mailed Jun. 21, 2011, for International Application No. PCT/JP2011/056123.
Takeda, Hiroaki et al., "Effective Substitutuin of Aluminum for Gallium in Langasite-type Crystals for a Pressure Sensor Use at High Temperature", 2005 IEEE Ultrasonic Symposium, 560-563.
Office Action for Chinese Application No. 201180012783.X dated Sep. 24, 2014.

Primary Examiner — Carol M Koslow
(74) Attorney, Agent, or Firm — Finnegan Henderson Farabow Garrett & Dunner LLP

(57) ABSTRACT

In accordance with the present invention, there is provided a method for producing a single LTGA crystal from a polycrystalline starting material prepared from a mixture of $La_2O_3$, $Ta_2O_5$, $Ga_2O_3$, and $Al_2O_3$, wherein a mixture having a composition represented by $y(La_2O_3)+(1-x-y-z)(Ta_2O_5)+z(Ga_2O_3)+x(Al_2O_3)$ (in the formula, $0<x\leq0.40/9$, $3.00/9<y\leq3.23/9$, and $5.00/9\leq z<5.50/9$) is used as the polycrystalline starting material, and a single LTGA crystal is grown using the Z-axis as a crystal growth axis. The grown LTGA single crystal is preferably subjected to a vacuum heat treatment. The single LTGA crystal grown by the method according to the present invention, which is highly insulative and highly stable, can be utilized in such applications as a piezoelectric element of a highly reliable combustion pressure sensor useful in measurement of a combustion pressure in a combustion chamber of an internal combustion engine.

13 Claims, 11 Drawing Sheets

HIGHLY INSULATIVE AND HIGHLY STABLE PIEZOELECTRIC SINGLE LTGA CRYSTAL, METHOD FOR PRODUCING THE SAME, PIEZOELECTRIC ELEMENT USING SAID SINGLE LTGA CRYSTAL, AND COMBUSTION PRESSURE SENSOR

TECHNICAL FIELD

The present invention relates to methods for producing highly insulative and highly stable piezoelectric oxide crystals. More specifically, the present invention relates to a method for producing a single LTGA crystal which is a piezoelectric oxide suitable for use in a piezoelectric element of a combustion pressure sensor, etc., which measures a combustion pressure in a combustion chamber of an internal combustion engine. The present invention also relates to a single LTGA crystal obtained by the production method, to a piezoelectric element using the single LTGA crystal, and to a combustion pressure sensor.

BACKGROUND ART

For example, in an automobile utilizing an internal combustion engine, fuel supply and ignition timing have been controlled for optimally controlling combustion against misfire, abnormal combustion, etc., by detecting the combustion pressure in a combustion chamber. Generally, a combustion pressure sensor utilizing an element with a piezoelectric oxide material exhibiting a piezoelectric effect (generating an electrical charge as a result of polarization occurring depending on an applied force (pressure)) has been used for detecting the combustion pressure in the combustion chamber.

In the piezoelectric element of a combustion pressure sensor, a single crystal of a piezoelectric oxide material is used. Conventionally, quartz has been used as a piezoelectric oxide material, langasite (LGS: $La_3Ga_5SiO_{14}$) having a higher piezoelectric constant than that of quartz has received attention since the early 1990s, and research has been conducted with a particular emphasis on langanite (LGN: $La_3Ga_{5.5}Nb_{0.5}O_{14}$) having the same structure as that of langasite. Langatate (LTG: $La_3Ta_{0.5}Ga_{5.5}O_{14}$) has received attention due to having a small variation of a piezoelectric constant with temperature and a high insulating property, and LTG is currently widely used. Also, LTGA ($La_3Ta_{0.5}Ga_{5.5-x}Al_xO_{14}$ (x=around 0.2 in most circumstances)) with a part of Ga of LTG substituted by Al has been known for 10 years or longer. LTGA has recently been shown to have a higher insulation resistance than that of LTG (Patent Literature 1) and has received attention.

Production of a single LTGA crystal has been performed by, e.g., a method (Czochralski method (CZ method)) of obtaining a single crystal by melting a sintered LTGA body (polycrystalline material) made by calcining a mixture of $La_2O_3$, $Ta_2O_5$, $Ga_2O_3$, and $Al_2O_3$ of a starting material weighed to give an objective stoichiometric single-crystal composition, immersing a seed crystal in a melt, and slowly pulling up the seed crystal.

As for a single LTG crystal as a ternary crystal, the congruent melting composition of a melt has been reported for obtaining a good single crystal with a few inclusions and cracks, and it is known to change the mixing ratio of lanthanum oxide, tantalum oxide, and gallium oxide of a starting material in the vicinity of a stoichiometric composition when a single crystal of a piezoelectric oxide material is produced from the melt (for example, see Patent Literature 2).

Among important characteristics necessary for a piezoelectric oxide material, an insulation resistivity has been known to be decreased by increasing temperature and to be decreased with a lapse of time. For example, Non Patent Literature 1 describes that, when a single LTG crystal grown in an oxygen atmosphere or an inert gas atmosphere is exposed to 550° C., insulation resistivity is decreased to around one-half of an initial value after 600 hours.

PRIOR ART LITERATURES

Patent Literatures

Patent Literature 1: WO 2006/106875
Patent Literature 2: JP 11-322495 A

Non Patent Literatures

Non Patent literature 1: S. A. Sakharov et al., Physical Properties of Lanthanum Gallium Tantalate Crystals for High-Temperature Application, 2005IEEE, Ultrasonics symposium

SUMMARY OF INVENTION

Problems to be Solved by the Invention

It is necessary that a piezoelectric material used in a piezoelectric element of a combustion pressure sensor have a high insulating property (high resistivity of the piezoelectric material) and long-term reliability of insulation resistivity. Specifically, from the need for operation at a high temperature in an internal combustion engine, an insulation resistivity of $1\times10^{10}$ Ω·cm or more at 300° C. or $3\times10^8$ Ω·cm or more at 500° C. is necessary and the insulation resistivity is also necessary to be stable for a long time in the case of left standing in the air at 500° C.

However, conventional LTGAs have had a drawback of decreasing insulation resistivity in a short time in the case of left standing in the air at 500° C. even when the insulation resistivity in an early stage satisfies the above-described conditions and being poor in reliability for use in piezoelectric elements.

An object of the present invention is to solve this problem by providing a method which enables production of a highly insulative and highly stable single LTGA crystal which can be used in a piezoelectric element of a highly reliable combustion pressure sensor useful for measuring a combustion pressure in a combustion chamber of an internal combustion engine. Objects of the present invention are also to provide a highly insulative and highly stable single LTGA crystal obtained by the production method and to provide a piezoelectric element containing the single LTGA crystal as a piezoelectric material and a combustion pressure sensor including the piezoelectric element.

Means to Solve the Problems

The method for producing a single LTGA crystal according to the present invention is a method for producing a single LTGA crystal from a polycrystalline starting material prepared from a mixture of $La_2O_3$, $Ta_2O_5$, $Ga_2O_3$, and $Al_2O_3$, wherein a mixture having a composition represented by $y(La_2O_3)+(1-x-y-z)(Ta_2O_5)+z(Ga_2O_3)+x(Al_2O_3)$ (in the formula, $0<x\leq0.40/9$, $3.00/9<y\leq3.23/9$, and $5.00/9\leq z<5.50/9$, more preferably $0.17/9\leq x\leq0.26/9$, $3.06/9\leq y\leq3.15/9$, and 5.14/9≤z≤5.32/9) is used as the polycrystalline starting material, and a single LTGA crystal is grown using the Z-axis as a crystal growth axis.

The grown single LTGA crystal is preferably subjected to a vacuum heat treatment. The insulation resistivity of the single LTGA crystal can be improved by the vacuum heat treatment. The vacuum heat treatment is preferably performed for 1-24 hours at a vacuum pressure of 1 torr (133.322 Pa) or less and a temperature of 1000° C. or more and 1450° C. or less.

Oxygen in an amount of 0.2-5% is preferably present in a single LTGA crystal growth atmosphere. The insulation resistivity of a grown single LTGA crystal can be improved by the presence of oxygen at a moderate concentration in the growth atmosphere.

The single LTGA crystal according to the present invention is a single LTGA crystal produced by a method wherein a mixture having a composition represented by $y(La_2O_3)+(1-x-y-z)(Ta_2O_5)+z(Ga_2O_3)+x(Al_2O_3)$ (in the formula, $0<x≤0.40/9$, $3.00/9<y≤3.23/9$, and $5.00/9≤z<5.50/9$, more preferably $0.17/9≤x≤0.26/9$, $3.06/9≤y≤3.15/9$, and $5.14/9≤z≤5.32/9$) is used as a polycrystalline starting material, and a single LTGA crystal is grown using the Z-axis as a crystal growth axis, the crystal having an insulation resistivity after left standing in atmospheric air at 500° C. for 100 hours after growth of $3×10^8$ Ω·cm or more.

The single LTGA crystal according to the present invention is also a single LTGA crystal produced by a method wherein a mixture having a composition represented by $y(La_2O_3)+(1-x-y-z)(Ta_2O_5)+z(Ga_2O_3)+x(Al_2O_3)$ (in the formula, $0<x≤0.40/9$, $3.00/9<y≤3.23/9$, and $5.00/9≤z<5.50/9$, more preferably $0.17/9≤x≤0.26/9$, $3.06/9≤y≤3.15/9$, and $5.14/9≤z≤5.32/9$) is used as a polycrystalline starting material, and a single LTGA crystal is grown using the X-axis as a crystal growth axis, the crystal having an initial insulation resistivity at 500° C. immediately after growth of $3×10^8$ Ω·cm or more, and an insulation resistivity after left standing in the air at 500° C. for 100 hours after the growth of also $3×10^8$ Ω·cm or more.

The insulation resistivity after left standing in the air at 500° C. for 100 hours after growth of the single LTGA crystal according to the present invention is preferably $5×10^8$ Ω·cm or more, more preferably $1×10^9$ Ω·cm or more.

The initial insulation resistivity at 500° C. immediately after growth of the single LTGA crystal according to the present invention is also preferably $5×10^8$ Ω·cm or more, more preferably $1×10^9$ Ω·cm or more.

The present invention further provides a piezoelectric element comprising the single LTGA crystal according to the present invention as a piezoelectric material. The piezoelectric element according to the present invention is characterized by having a piezoelectric constant with a low temperature dependence, with a rate of change of piezoelectric constant value at a given temperature of 500° C. or less relative to the piezoelectric constant value at 25° C. being within ±3%.

The present invention further provides a combustion pressure sensor comprising a piezoelectric element using the single LTGA crystal according to the present invention as a piezoelectric material.

Effects of Invention

The present invention enables a single LTGA crystal which has high insulation resistivity immediately after growth, with the insulation resistivity being stable even when exposed to a high temperature of 500° C. in atmospheric air for a long time, to be utilized. Specifically, the single LTGA crystal grown by the method of the present invention has an improved initial insulation resistivity measured at 500° C. immediately after the growth, in comparison with conventional ones, has no deterioration thereof, and is stable for 100 hours or more even when the single crystal is left standing in the air at 500° C. Particularly, in the single LTGA crystal produced by being further subjected to a vacuum heat treatment after the growth, an insulation resistivity exceeding $1×10^9$ Ω·cm even at 500° C. can be realized.

Use of a piezoelectric element produced from the single LTGA crystal according to the present invention enables provision of a highly reliable combustion pressure sensor which can measure, for a long period, a combustion pressure in a combustion chamber, at a high temperature, of an internal combustion engine. Specifically, even when a repetition cycle of 0-20 MPa is repeated 100 million times or more under the condition of a piezoelectric element portion temperature of 500° C., stable sensing is possible.

In addition, the piezoelectric element according to the present invention, which exhibits excellent characteristics as described above, may also be utilized even in such applications as tire air pressure sensors.

MODE FOR CARRYING OUT THE INVENTION

Figure 1:
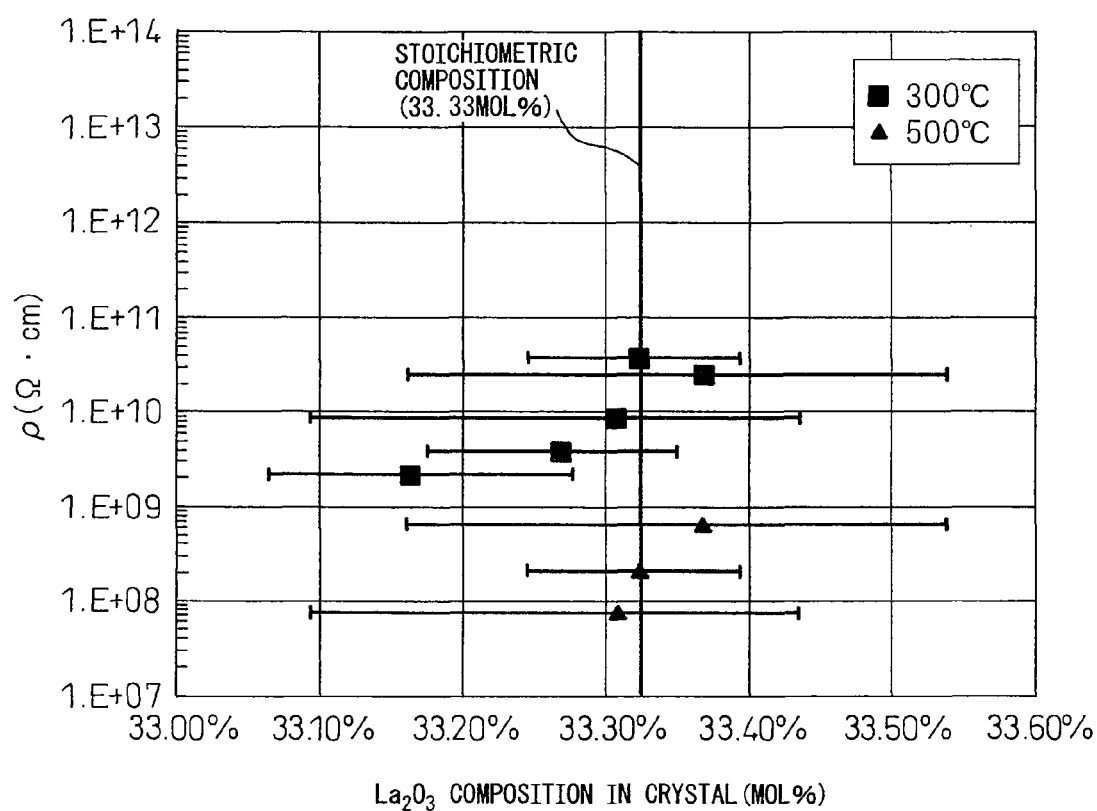
FIG. 1 is a graph indicating relationships between composition ranges and insulation resistivities by EPMA quantitative analysis of $La_2O_3$ in sample wafers of the single LTGA crystals according to the present invention.

First, how the inventors accomplished the present invention will be described.

The inventors made various attempts to achieve the object of providing a highly insulative and highly stable single LTGA crystal which can be used in a piezoelectric element of a highly reliable combustion pressure sensor useful for measuring a combustion pressure in a combustion chamber of an internal combustion engine and made an attempt, as one thereof, of producing single crystals having compositions departed from the stoichiometric composition of LTGA. For this purpose, various single LTGA crystals were grown using starting material mixtures with compositions in which the amounts of four components of $La_2O_3$, $Ta_2O_5$, $Ga_2O_3$, and $Al_2O_3$ which are oxide materials as starting materials were changed from the amounts (33.33 mol %, 5.56 mol %, 58.89 mol %, and 2.22 mol %, respectively) giving a single crystal (x=0.2) with the stoichiometric composition. As a result, it was found that single LTGA crystals which are suitable as piezoelectric materials for use in a piezoelectric element of a combustion pressure sensor and have high insulating properties and high long-term reliability of insulation resistivity are obtained by making the amount of $La_2O_3$ more than the amount giving a single crystal with the stoichiometric composition (hereinafter which may also be referred to as "La-rich"). More specifically, it was found that a single LTGA crystal grown using, as a starting material, a polycrystalline starting material with a composition represented by the following formula:

$$y(La_2O_3)+(1-x-y-z)(Ta_2O_5)+z(Ga_2O_3)+x(Al_2O_3)$$

(in the formula, $0<x\leq0.40/9$, $3.00/9<y\leq3.23/9$, and $5.00/9\leq z<5.50/9$, more preferably $0.17/9\leq x\leq0.26/9$, $3.06/9\leq y\leq3.15/9$, and $5.14/9\leq z\leq5.32/9$) exhibits a high initial insulation resistivity and an insulation resistivity stable at a high temperature of 500° C. for a long time.

When experiments were repeated, it was found that even a single crystal grown under La-rich conditions does not always exhibit the long-term stability of insulation resistivity, and, when examination was further performed from various view points, it was found that realization of the long-term stability of insulation resistivity of single LTGA crystal requires that the Z-axis is to be used as the single crystal growth axis. Also, it was found that the insulation resistivity is improved by subjecting the grown single LTGA crystal to a vacuum heat treatment.

When the compositions of the single LTGA crystals according to the present invention having high insulation resistivity and long-term stability thereof realized, were examined, any difference in composition after crystallization between the crystals of the invention and crystals with a low insulating property, crystals that do not exhibit long-term stability, or the like was not able to be found in a current analysis technique even when intentionally varying a starting material composition, and the compositions of the grown single crystals tended to converge on 33.05 mol % to 33.55 mol %, for $La_2O_3$, including its stoichiometric composition of 33.33 mol %. These circumstances are indicated in FIG. 1.

The graph illustrated in FIG. 1 indicates relationships between composition ranges by EPMA quantitative analysis of $La_2O_3$ in LTGA single crystal sample wafers Z-axis-grown from starting materials with different compositions in which amounts of $La_2O_3$ exceed the amount giving LTGA with the stoichiometric composition and insulation resistivities ρ. A horizontal line in the graph indicates the data range of $La_2O_3$ composition, measured by taking ten points from a sample wafer having a specific insulation resistivity at random. The average $La_2O_3$ compositions of four and three samples measured at 300° C. and 500° C., respectively, are represented by tetragonal and triangular points, respectively. As seen in this figure, the $La_2O_3$ compositions in the single LTGA crystals each indicating a peculiar insulation resistivity, have narrow ranges of 33.05 to 33.55 mol % including 33.33 mol % of the stoichiometric composition regardless of starting material compositions. Thus, FIG. 1 exhibits that the single LTGA crystals are not differentiated in terms of crystalline compositions since the measurement data ranges from the EPMA quantitative analysis of all the single LTGA crystals overlap each other although the insulation resistivity values thereof are different. In other words, in the single LTGA crystals obtained using the starting materials of the compositions containing $La_2O_3$ the amounts of which exceed the amount giving LTGA with the stoichiometric composition and using the Z-axes as the crystal growth axes, even when the starting material compositions are intentionally changed, the $La_2O_3$ compositions converge in the range of 33.05 mol % to 33.55 mol % including the stoichiometric composition (33.33 mol %) indicated by a vertical line in the figure, and any compositionally significant difference cannot be found in the current analysis technique.

As described above, the single LTGA crystals produced by the method according to the present invention compositionally converge on the stoichiometric composition and cannot be distinguished from the conventional LTGA single crystals as far as it is concerned. Nevertheless, the single LTGA crystal produced by the method according to the present invention exhibits a high insulating property and high stability superior to those of the conventional single LTGA crystals. Although the reason therefor has not thoroughly been clarified, it is considered that when a single LTGA crystal is produced by the method of the invention, the insulating property and stability of the single crystal are improved since defects in the single LTGA crystal are fewer than those in the case of production by a conventional method for some reason even if any difference between the composition of the highly insulative and highly stable single LTGA crystal according to the present invention and the compositions of the conventional LTGA single crystals is not distinguished at the current level of analysis and a difference between the minute composition ratios in the single crystal is not a dominant factor.

Figure 2:
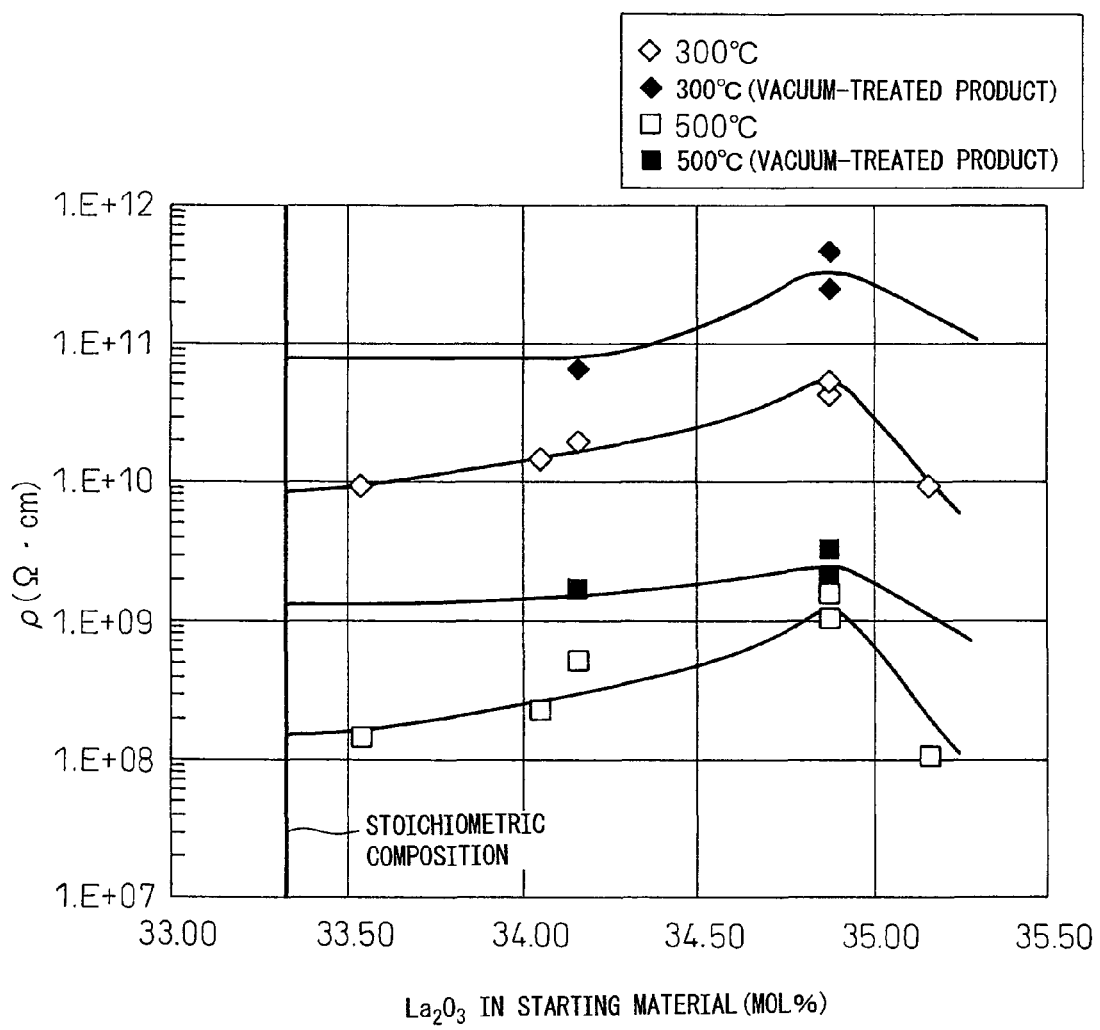
FIG. 2 is a graph indicating relationships between the amounts of $La_2O_3$ in starting materials and the initial insulation resistivities of grown LTGA single crystals.

As for single LTGA crystals Z-axis-grown from melts of sintered LTGA bodies (polycrystalline materials) produced from various starting material samples, in which the amounts of $La_2O_3$ were made to be more than 33.33 mol % which is the amount giving the single crystal with the stoichiometric composition, their insulation resistivities (initial insulation resistivities) measured at 300° C. and 500° C. after the growth and their insulation resistivities measured at the same temperatures after vacuum heat treatment are shown in Table 1. The initial insulation resistivities were measured after grown single crystal blocks were cut into wafers for measuring resistivity, samples for measurement in which electrodes were formed between bulks to be measured so as not to be short-circuited were placed in a tube furnace for experiment, the temperature in the furnace was increased to 300° C. (and 500° C.), and the temperatures of the sample wafers reached 300° C. (and 500° C.). Wafers for measuring a resistivity cut from the grown blocks were subjected to a vacuum heat treatment ($10^{-5}$ torr (1.33 mPa), 1200° C., 2 hours), after which electrodes were formed on the wafers, and the insulation resistivities after the vacuum heat treatment were measured in the same manner as described above. The graph of the data from Table 1 is indicated in FIG. 2.

TABLE 1

| Samples | Starting Materials | | Initial Insulating Resistivities ($\Omega \cdot cm$) | | Insulating Resistivities after Vacuum Treatment ($\Omega \cdot cm$) | |
|---|---|---|---|---|---|---|
| | La2O3 (mol %) | Ga2O3 (mol %) + Al2O3 (mol %) | 300° C. | 500° C. | 300° C. | 500° C. |
| Sample 1 | 34.16 | 60.46 | 1.98E+10 | 5.2E+08 | 6.8229E+10 | 1.819E+09 |
| Sample 2 | 34.05 | 60.58 | 1.51E+10 | 2.29E+08 | | |
| Sample 3 | 34.88 | 59.70 | 5.21E+10 | 1.52E+09 | 4.7798E+11 | 3.476E+09 |
| Sample 4 | 34.88 | 59.70 | 4.37E+10 | 1.05E+09 | 2.6637E+11 | 1.998E+09 |
| Sample 5 | 35.16 | 59.53 | 9.38E+09 | 1.11E+08 | | |
| Sample 6 | 33.54 | 60.92 | 9.49E+09 | 1.51E+08 | | |

As is clear from the data, the single LTGA crystals with initial insulation resistivities of $1\times10^{10}$ $\Omega \cdot cm$ or more at 300° C. and $3\times10^{8}$ $\Omega \cdot cm$ or more at 500° C. were obtained by making the starting materials have the $La_2O_3$ amounts of 34.10 mol %<$La_2O_3$≤34.88 mol %, which is more than 33.33 mol % giving the single LTGA crystal with the stoichiometric composition. Also, it was found that the insulation resistivity values were increased by subjecting the grown single crystals to the vacuum heat treatment (Samples 1, 3, and 4). It was found that the single crystals can be grown although inclusions and cracks are present in the crystals when the amount of $La_2O_3$ in the starting material is 33.60-34.60 mol %, in contradistinction to 33.33 mol % as the stoichiometric composition, while a heterogenous phase may adhere to the growing crystal (occurrence of polycrystallization) as well as inclusions and cracks are present in the crystal when the amount of $La_2O_3$ is 34.72-34.88 mol %. Further, it was found that considerable amount of heterogenous phase often adheres to the crystal to cause polycrystallization when the amount of $La_2O_3$ exceeds 35.00 mol % and the amount of $La_2O_3$ of 36.00 mol % is the limit at which the LTGA single crystal is obtained.

Figure 3:
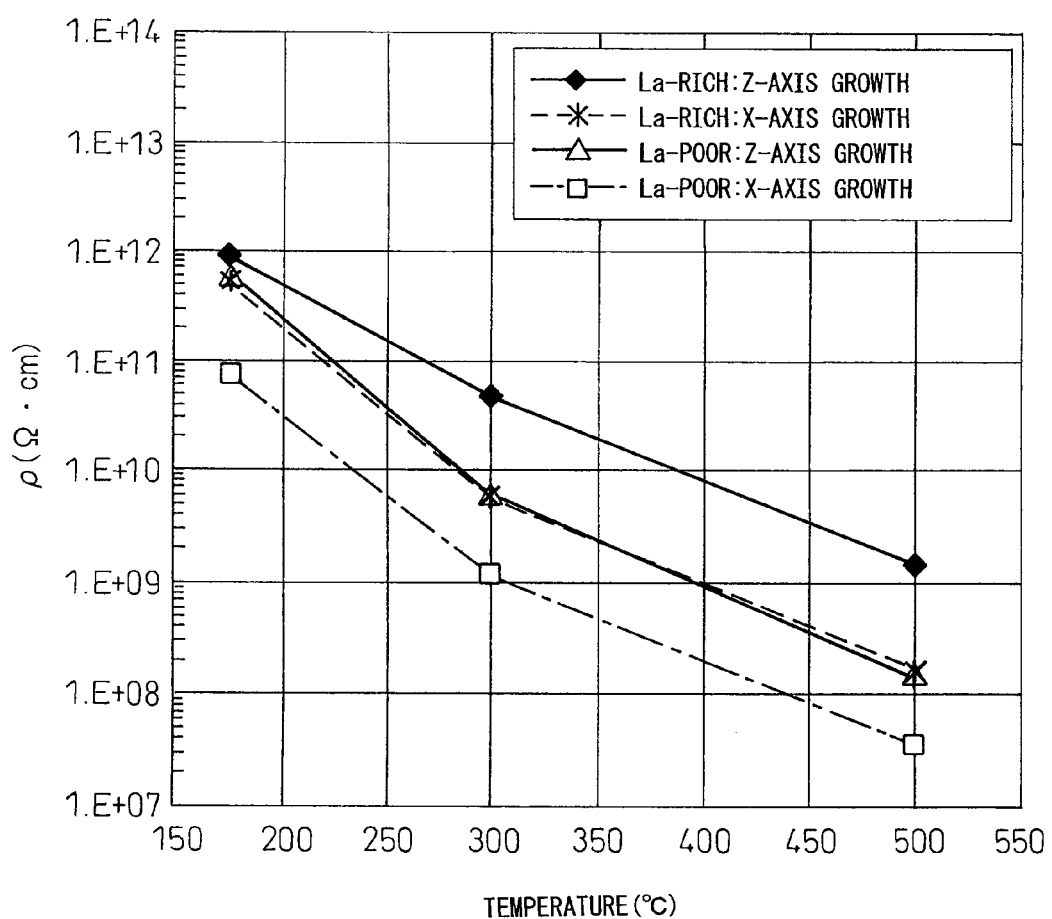
FIG. 3 is a graph in which the amounts of $La_2O_3$ in raw material mixtures and the initial insulation resistivities of the single LTGA crystals depending on crystal growth axes are plotted against temperature.

FIG. 3 exhibits the data of the initial insulation resistivities, measured at 175° C., 300° C., and 500° C., of single LTGA crystals produced by Z-axis growth and X-axis growth using an La-rich raw material mixture (34.88 mol % $La_2O_3$, 57.41 mol % $Ga_2O_3$, and 2.29 mol % $Al_2O_3$) and single LTGA crystals produced by Z-axis growth and X-axis growth using a raw material mixture (33.11 mol % $La_2O_3$, 59.11 mol % $Ga_2O_3$, and 2.22 mol % $Al_2O_3$) the amount of $La_2O_3$ in which is, on the contrary, less than that of the stoichiometric composition (hereinafter which may also be referred to as "La-poor"). The single LTGA crystal (Sample 3 in Table 1) produced by the Z-axis growth from the La-rich raw material mixture in accordance with the invention exhibits an insulation resistivity exceeding $3\times10^{8}$ $\Omega \cdot cm$ at 500° C., whereas the other single LTGA crystals have insulation resistivities of less than $3\times10^{8}$ $\Omega \cdot cm$ at 500° C. Thus, it is found that the method for producing a single crystal according to the present invention, which uses an La-rich raw material mixture and grows a single crystal using the Z-axis as a crystal growth axis, is effective for producing a single LTGA crystal usable in a combustion pressure sensor used in a combustion chamber of an internal combustion engine in which a particularly high insulation resistivity of $1\times10^{9}$ $\Omega \cdot cm$ or more at 500° C. is demanded.

Figure 4:
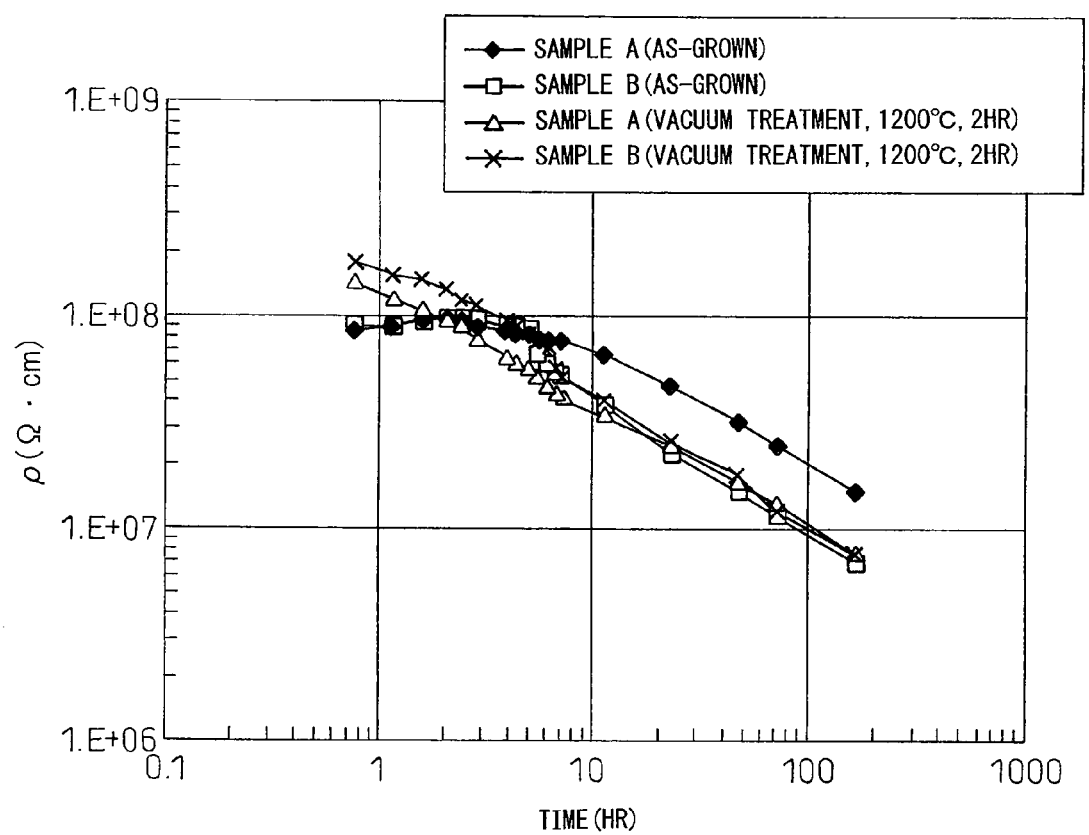
FIG. 4 is a graph indicating variations of insulation resistivities with time when single LTGA crystal samples obtained by a conventional method are left standing at 500° C.

FIG. 4 indicates the variations of the insulation resistivities with time when single LTGA crystal samples (as grown (in the figure, referred to as "AS-GROWN")) obtained by a conventional method and ones subjected to a vacuum heat treatment ($10^{-5}$ torr (1.33 mPa), 1200° C., 2 hours) were left standing at 500° C. Thus, the insulation resistances of single LTGA crystals obtained by a conventional method are generally decreased by being continuously exposed to a high temperature of 500° C.

Figure 5:
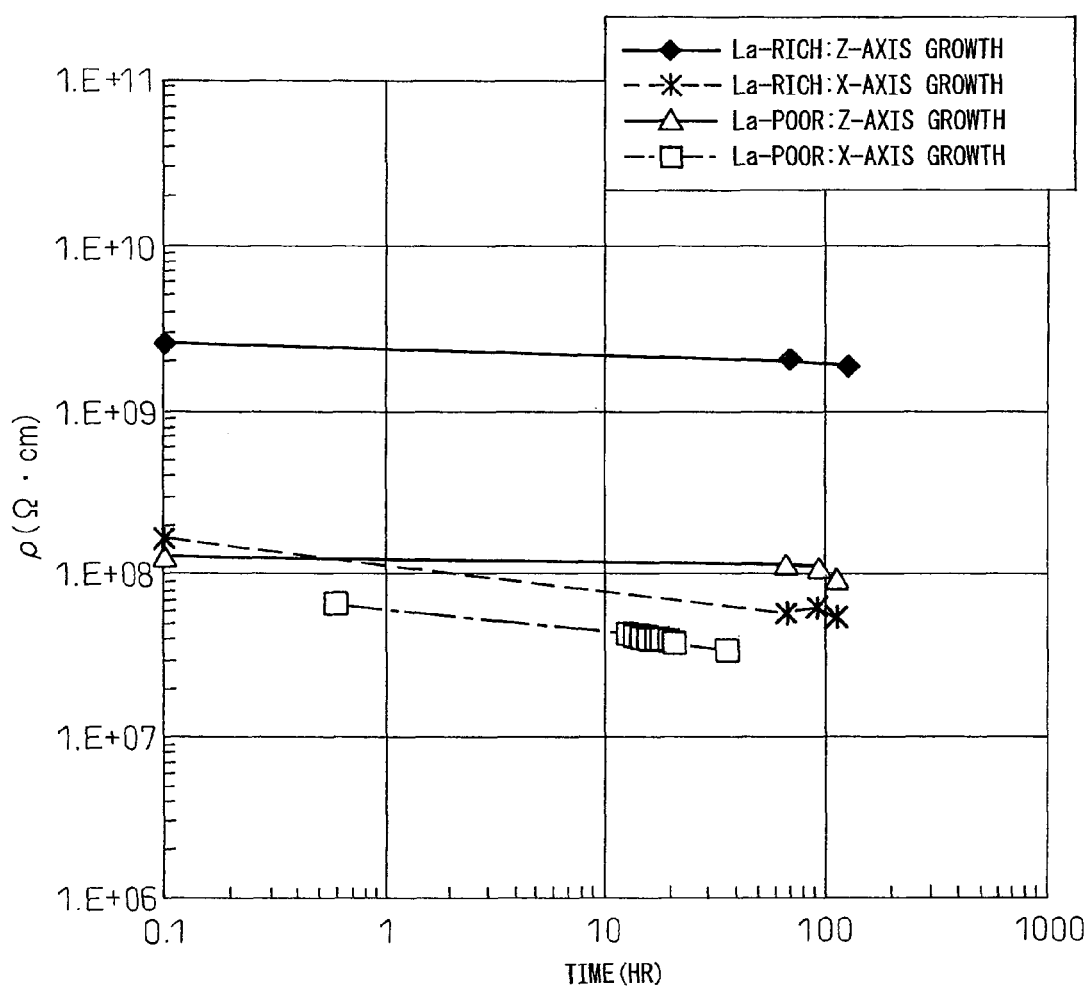
FIG. 5 is a graph indicating variations of insulation resistivities with time when the same single LTGA crystals as exhibited in FIG. 3 are left standing at 500° C.

FIG. 5 indicates variations of insulation resistivities with time when the four single LTGA crystals same as those used in the measurement of the data of initial insulation resistivities exhibited in FIG. 3 were left standing at 500° C. It is found that the LTGA single crystal according to the present invention (La-rich, Z-axis growth) stably exhibits an insulation resistivity of more than $3\times10^{8}$ $\Omega \cdot cm$ for 100 hours or more.

It is found from Table 1, the data of FIG. 2 and the data of FIG. 5 that the single LTGA crystal according to the present invention can sufficiently be used in a combustion pressure sensor used in a combustion chamber of an internal combustion engine demanding a particularly high insulation resistivity of $1\times10^{9}$ $\Omega \cdot cm$ or more at 500° C. for a long term. Also, the single LTGA crystal according to the present invention is applicable to applications that need not satisfy such particularly severe conditions as described above, for example, applications such as tire air pressure sensors. By applying the single LTGA crystal according to the present invention to such a sensor, the long-term reliability of the sensor can be improved markedly.

Figure 6:
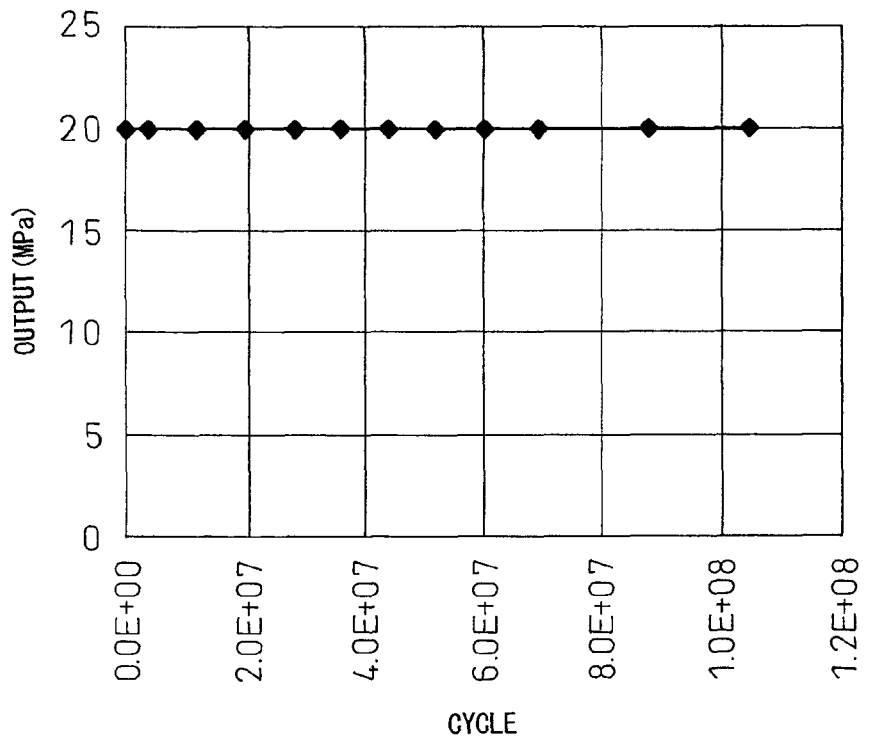
FIG. 6 is a graph indicating the results of an endurance cycle test at 500° C. of a piezoelectric element produced from the single LTGA crystal according to the present invention.

FIG. 6 indicates results of an endurance cycle test, at 500° C., of a piezoelectric element produced from the same single LTGA crystal according to the present invention (La-rich, Z-axis growth) as used in the data measurement of FIGS. 3 and 5. It is found that a constant element output was obtained over $1.0\times10^{8}$ cycles or more.

Figure 7:
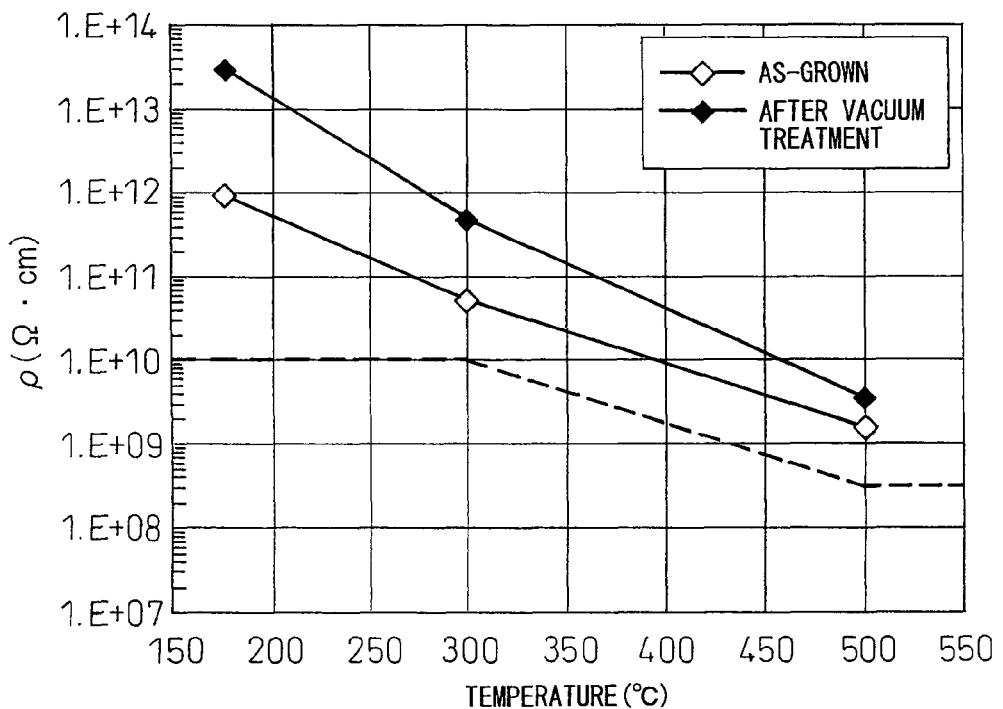
FIG. 7 is a graph indicating the initial insulation resistivities of the single LTGA crystals according to the present invention, as grown and subjected to a vacuum heat treatment after growth.

FIG. 7 indicates that the insulation resistivity of the single crystal subjected to a vacuum heat treatment (1200° C., $10^{-5}$ torr (1.33 mPa), 2 hours) after growth among the single LTGA crystals according to the present invention, is improved in comparison with the single crystal as grown (in the figure, referred to as "AS-GROWN"). In the figure, a region above the broken line corresponds to the region of insulation resistivity needed for a piezoelectric element of a combustion pressure sensor which measures a combustion pressure in a combustion chamber of an internal combustion engine. It is found that the single LTGA crystals produced by the method according to the present invention satisfy the conditions of insulation resistivity needed for a piezoelectric element of a combustion pressure sensor at any temperatures and the insulation resistivity is further improved by a vacuum heat treatment of the single crystal.

Figure 8:
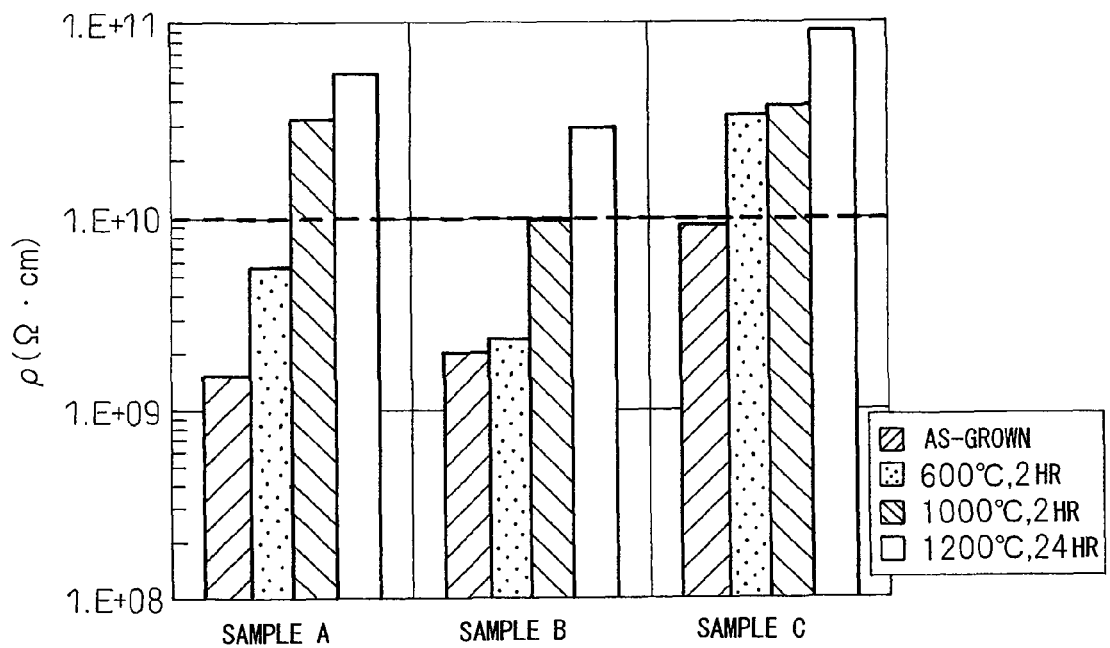
FIG. 8 is a graph indicating variations of the initial insulation resistivities of the single LTGA crystal samples according to the present invention depending on vacuum heat treatment conditions.

FIG. 8 indicates results of measurement of insulation resistivity at 300° C. of each of three single LTGA crystal samples grown according to the present invention carried out after the samples were treated at a vacuum pressure of $10^{-5}$ torr (1.33 mPa) by changing treatment conditions (heating temperature and time), in comparison with insulation resistivity of a single crystal as grown (in the figure, referred to as "AS-GROWN").

The results of this figure revel that the insulation resistivity is improved with increasing vacuum treatment temperature and prolonging treatment time. However, the treatment temperature in the present invention is 1000° C. or more and 1450° C. (temperature that is slightly lower than the melting point of the LTGA single crystal) or less, preferably 1100-1300° C., more preferably 1150-1250° C., in consideration that the high treatment temperature and the long treatment time are disadvantageous from the viewpoint of productivity. Also, the vacuum treatment time is 1-24 hours, more preferably 1-10 hours, more preferably 1.5-5 hours. The vacuum treatment pressure is preferably 1 torr (133.322 Pa) or less. The vacuum treatment pressure is preferably lower but depends on the characteristics of an apparatus used in the vacuum treatment and the ability of a vacuum generation device. As an example, around $10^{-7}$ torr ($1.33 \times 10^{-5}$ Pa) appears to be a practical ultimate vacuum pressure in most cases. For example, it was found that a single crystal, the insulation resistivity of which is sufficiently improved in comparison with a single LTGA crystal as grown (improved twice in comparison in terms of insulation resistivity at 500° C.), is obtained by a vacuum heat treatment at 1200° C. and $10^{-5}$ torr (1.33 mPa) for 2 hours (see FIG. 7).

Figure 9:
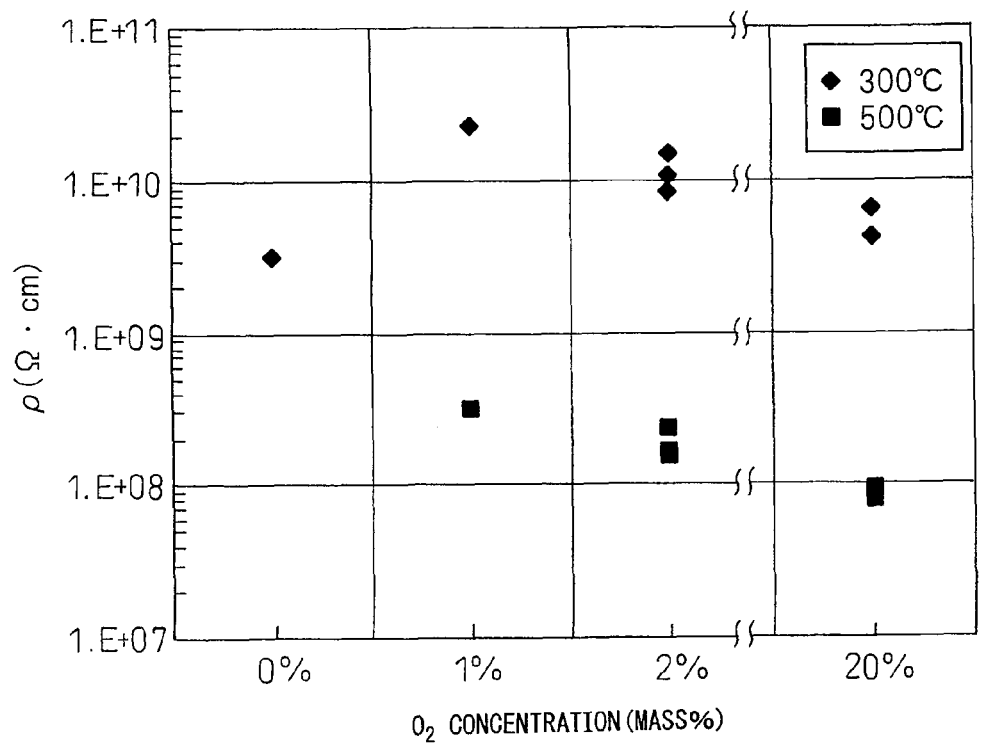
FIG. 9 is a graph indicating relationships between the concentrations of oxygen in single LTGA crystal growth atmospheres and the initial insulation resistivities of grown single crystals.

In a single crystal growth atmosphere in the method according to the present invention, it is preferred that some oxygen is present. This is because a single LTGA crystal, which is an oxide, lacks oxygen and is prone to embrittle when no oxygen is present in the growth atmosphere. FIG. 9 indicates relationships between the concentrations of oxygen in single LTGA crystal growth atmospheres and the initial insulation resistivities of grown single crystals, measured at 300° C. and 500° C. It is found that the insulation resistivity value reaches a peak at an oxygen concentration of around 1% in the growth atmosphere. The concentration of oxygen in a growth atmosphere is preferably 0.2-5%, more preferably 0.3-2%.

The single LTGA crystal according to the present invention is suitable as a piezoelectric material used in a piezoelectric element of a combustion pressure sensor of an internal combustion engine for which an insulation resistivity of $3 \times 10^8$ $\Omega \cdot cm$ or more is needed at a high temperature for a long term. When it is used as a piezoelectric material used in a piezoelectric element of a combustion pressure sensor of an internal combustion engine, the insulation resistivity of the single LTGA crystal according to the present invention after left standing in atmospheric air at 500° C. for 100 hours is preferably $5 \times 10^8$ $\Omega \cdot cm$ or more, further preferably $1 \times 10^9$ $\Omega \cdot cm$ or more. The single LTGA crystal according to the present invention (i.e., the single LTGA crystal produced by the method according to the present invention) can be used for producing a piezoelectric element only by being subjected to necessary shaping processing. Therefore, the above-described initial insulation resistivity at 500° C. subsequent to growth of the single crystal according to the present invention is also substantially the insulation resistivity of the LTGA single crystal prior to being shaped into the piezoelectric element to be installed on the combustion pressure sensor or the like.

EXAMPLES

The present invention will now be further described with reference to examples. It should be noted that the present invention is not limited to the examples below.

Example 1

In this example, a single LTGA crystal was produced from a starting material with a composition represented by $3.139/9(La_2O_3)+0.488/9(Ta_2O_5)+5.167/9(Ga_2O_3)+0.206/9(Al_2O_3)$.

Weighing of 160.7 g, 33.9 g, 152.2 g, and 3.3 g of starting materials $La_2O_3$, $Ta_2O_5$, $Ga_2O_3$, and $Al_2O_3$, respectively, which were previously heat treated at 1000° C. for controlling a water absorption percentage, was performed, and dry blending of them in a ball mill for 8 hours or more was performed to prepare a starting material mixture.

The starting material mixture was pressed by isostatic pressing at 1 ton and then calcined to produce a sintered body having a crystal structure of interest by solid phase reactions. Temperature increase in this time was carried out at the following conditions: temperature increase rate of 180° C./h and holding at 500° C. for 2 hours, holding at 900° C. for 2 hours, and holding at 1350° C. for 5 hours.

A crucible filled with 350 g of the sintered body was put in a heating chamber, and the crucible was used as a heater by virtue of direct induction heating to melt the sintered body (melt temperature of 1470° C. and a concentration of 1% of oxygen in a heating atmosphere). A seed crystal with a certain crystal orientation was brought into contact with a melt surface while being rotated at 10 rpm, the seed crystal was then pulled from the melt by automatic control utilizing a computer to make a shoulder, and subsequently the Z-axis growth of single crystal was performed also by automatic control utilizing the computer to make a single LTGA crystal having a diameter of 20 mm and a straight body length of 20 mm. Then, the single crystals were raised and separated from the melt, cooled to room temperature by automatic control utilizing the computer, and then taken from the chamber to provide a finished single LTGA crystal. It was found that the finished single crystal had a stoichiometric composition represented approximately by the formula $La_3Ta_{0.5}Ga_{5.3}Al_{0.2}O_{14}$ by EPMA analysis although the La starting material was excessively present in the starting material mixture from a stoichiometric viewpoint.

The initial insulation resistivity of the finished single crystal measured at 500° C. was $1.52 \times 10^9$ $\Omega \cdot cm$. The insulation resistivity of the single crystal at 500° C., which was subjected to a vacuum heat treatment under the conditions of 1200° C., $10^{-5}$ torr (1.33 mPa), and 2 hours, was $3.48 \times 10^9$ $\Omega \cdot cm$. Variation with time of the insulation resistivity when the single crystal subjected to the vacuum heat treatment was left standing at 500° C. was as indicated in FIG. 5 (La-rich, Z-axis growth).

Example 2

Figure 10:
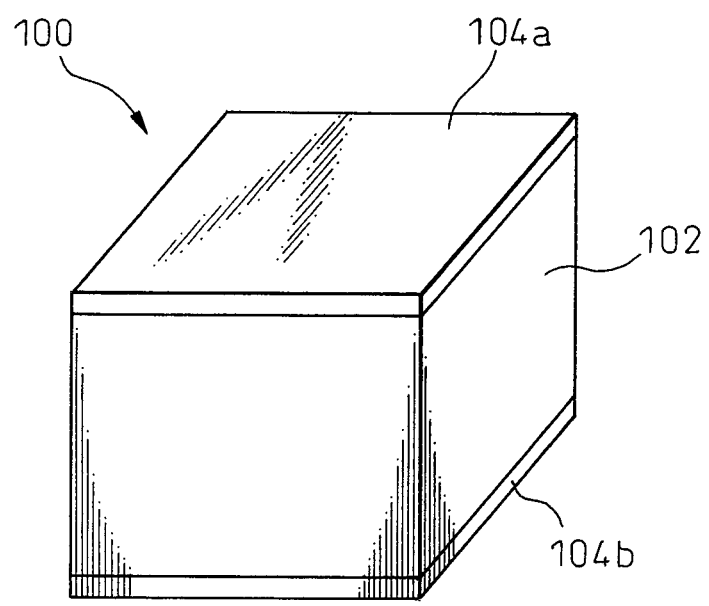
FIG. 10 is a perspective view illustrating a piezoelectric element produced in Example 2.

A piezoelectric element 100 having a structure schematically illustrated in FIG. 10 was produced using the single LTGA crystal (without the vacuum heat treatment) produced in Example 1. The piezoelectric element 100 has a structure in which the single LTGA crystal 102 is sandwiched between electrodes 104a and 104b placed on the two ends in the X-crystal axis direction thereof. When a stress is applied to the X-crystal axis direction (vertical direction in the piezoelectric element 100 in FIG. 10), an electrical charge is output only in the X-crystal axis.

Figure 11:
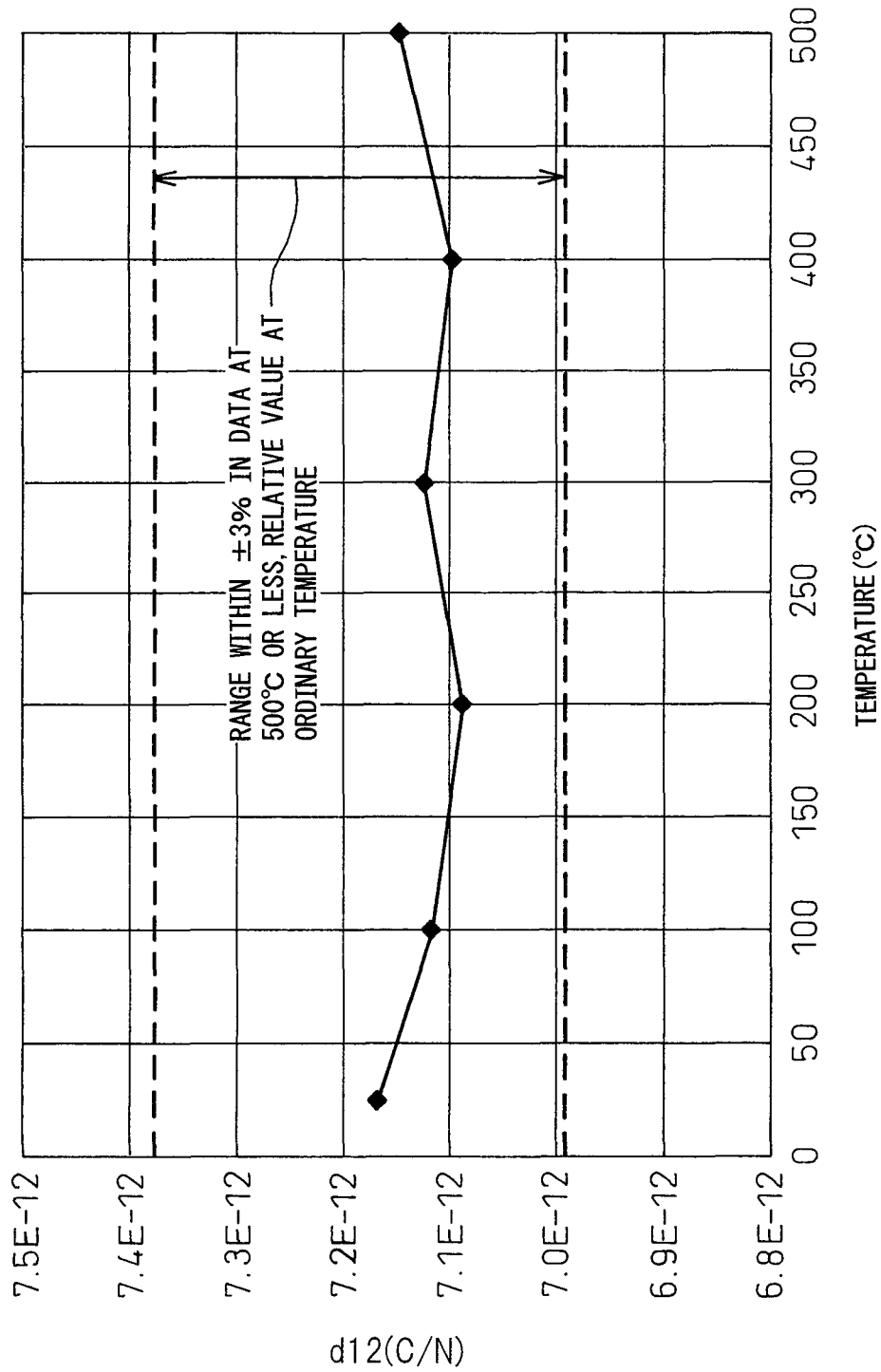
FIG. 11 is a graph indicating a relationship between the piezoelectric constant of the piezoelectric element produced in Example 2 and temperature.

When the produced piezoelectric element was heated to 500° C. and subjected to a repetition cycle test at 0-20 MPa, the stable operation of 100 million ($1 \times 10^8$) cycles or more was possible (see FIG. 6). In addition, rates of change of piezoelectric constants measured at 100, 200, 300, 400, and 500° C. ($7.12\times10^{-12}$, $7.09\times10^{-12}$, $7.12\times10^{-12}$, $7.10\times10^{-12}$, and $7.15\times10^{-12}$ pC/N, respectively) relative to the piezoelectric constant of the piezoelectric element at a room temperature of 25° C. ($7.17\times10^{-12}$ pC/N) were 3% or less as seen in FIG. 11 (within the range between the upper and lower broken lines in the figure).

Example 3

Figure 12:
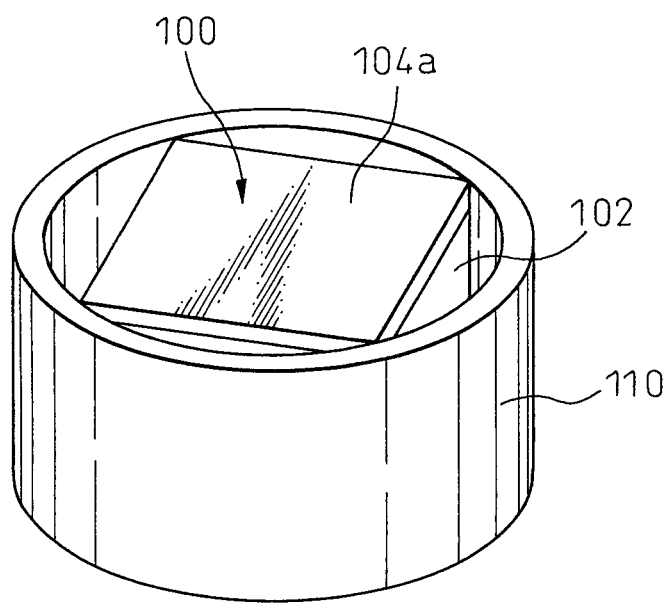
FIG. 12 is a perspective view illustrating the piezoelectric element of Example 2, inserted into a cylindrically-shaped sensor housing.
Figure 13:
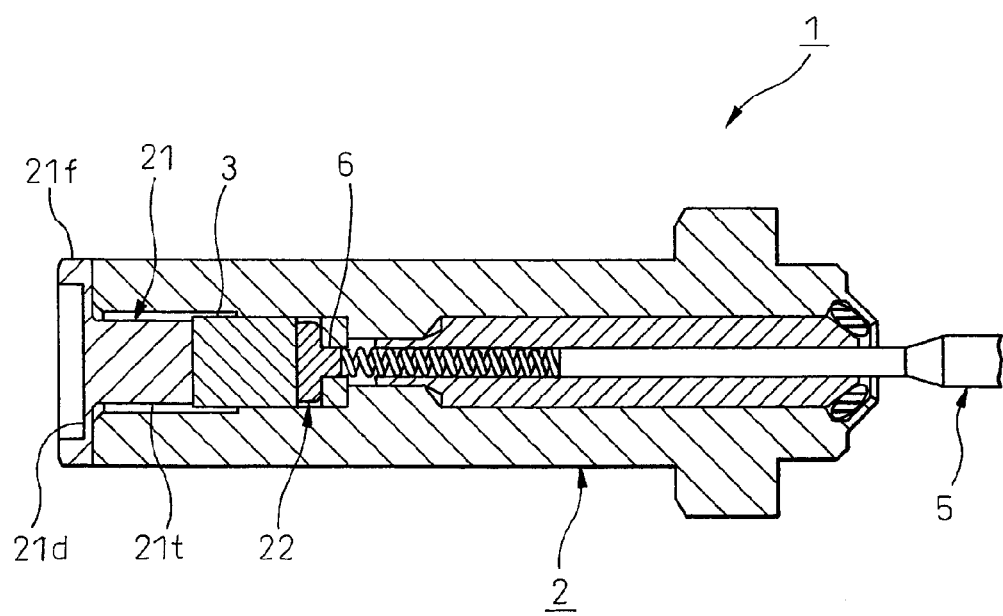
FIG. 13 is a view for explaining a pressure sensor (combustion pressure sensor) produced in Example 3.

A cylindrically-shaped sensor housing 110 into which the piezoelectric element 100 produced in Example 2 was inserted as illustrated in FIG. 12 was used to produce a pressure sensor (combustion pressure sensor) 1 the cross section structure of which is schematically illustrated in FIG. 13. This pressure sensor includes a piezoelectric element 3 accommodated in a housing 2 and an electrode portion 22 therefor (corresponding to the electrode 104a (or 104b) in the element in FIG. 10), and a diaphragm head 21 is placed in the front of the piezoelectric element 3. The diaphragm head 21 is constituted by a diaphragm portion 21d on which pressure acts, a flange portion 21f constituting the periphery of the diaphragm head 21, and a transfer portion 21t located in the rear of the diaphragm portion 21d, and the transfer portion 21t serves as one electrode portion surface-contacting with the front surface of the piezoelectric element 3. The electrode portion 22 in the rear of the piezoelectric element 3 integrally includes a protrusion-shaped lead side electrode portion 6, and an electrical signal output from the piezoelectric element 3 under pressure is supplied from the lead side electrode portion 6 to the outside of the sensor through a lead 5.

It was confirmed that the produced pressure sensor was able to be stably operated even after 100 million combustion cycles at 500° C., when being installed in an endurance tester imitating the inside of a combustion chamber of an automobile engine and subjected to a combustion pressure measurement test in a combustion chamber.

REFERENCE SIGNS LIST

1 Pressure sensor
100 Piezoelectric element
102 LTGA single crystal
104a, 104b Electrode
110 Sensor housing

The invention claimed is:

1. A method for producing a single LTGA crystal from a polycrystalline starting material prepared from a mixture of $La_2O_3$, $Ta_2O_5$, $Ga_2O_3$, and $Al_2O_3$, wherein a mixture having a composition represented by $y(La_2O_3)+(1-x-y-z)(Ta_2O_5)+z(Ga_2O_3)+x(Al_2O_3)$ (in the formula, $0<x\leq0.40/9$, $3.00/9<y\leq3.23/9$, and $5.00/9\leq z<5.50/9$) is used as the polycrystalline starting material, and a single LTGA crystal is grown using the Z-axis as a crystal growth axis.

2. The method for producing a single LTGA crystal according to claim 1, wherein the grown single LTGA crystal is subjected to a vacuum heat treatment.

3. The method for producing a single LTGA crystal according to claim 2, wherein the vacuum heat treatment is performed for 1-24 hours at a vacuum pressure of 1 torr (133.322 Pa) or less and a temperature of 1000° C. or more and 1450° C. or less.

4. The method for producing a single LTGA crystal according to claim 1, wherein oxygen in an amount of 0.2-5% is present in a single LTGA crystal growth atmosphere.

5. A single LTGA crystal produced by a method wherein a mixture having a composition represented by $y(La_2O_3)+(1-x-y-z)(Ta_2O_5)+z(Ga_2O_3)+x(Al_2O_3)$ (in the formula, $0<x\leq0.40/9$, $3.00/9<y\leq3.2319$, and $5.00/9\leq z<5.5019$) is used as a polycrystalline starting material, and a single LTGA crystal is grown using the Z-axis as a crystal growth axis, the crystal having an initial insulation resistivity at 500° C. immediately after growth of $3\times10^8$ Ω·cm or more, and an insulation resistivity after left standing in the air at 500° C. for 100 hours after the growth of also $3\times10^8$ Ω·cm or more.

6. The single TGA crystal according to claim 5, having an insulation resistivity after left standing in the air at 500° C. for 100 hours after growth of $5\times10^8$ Ω·cm or more.

7. The single LTGA crystal according to claim 6, having an insulation resistivity after left standing in the air at 500° C. for 100 hours after growth of $1\times10^9$ Ω·cm or more.

8. The single LTGA crystal according to claim 5, having an initial insulation resistivity at 500° C. immediately after growth of $5\times10^8$ Ω·cm or more.

9. The single LTGA crystal according to claim 8, having an initial insulation resistivity at 500° C. immediately after growth of $1\times10$ Ω·cm or more.

10. A piezoelectric element comprising the single LTGA crystal according to claim 5.

11. The piezoelectric element according to claim 10, wherein a rate of change of piezoelectric constant value at a given temperature of 500° C. or less relative to the piezoelectric constant value at 25° C. is within ±3%.

12. A combustion pressure sensor comprising a piezoelectric element including the single LTGA crystal according to claim 5.

13. The combustion pressure sensor according to claim 12, wherein a rate of change of piezoelectric constant value at a given temperature of 500° C. or less relative to the piezoelectric constant value of the piezoelectric element at 25° C. is within ±3%.

* * * * *

UNITED STATES PATENT AND TRADEMARK OFFICE
CERTIFICATE OF CORRECTION

PATENT NO. : 9,005,466 B2
APPLICATION NO. : 13/583600
DATED : April 14, 2015
INVENTOR(S) : Takayuki Hayashi et al.

It is certified that error appears in the above-identified patent and that said Letters Patent is hereby corrected as shown below:

In The Claims

Claim 5, col. 12, line 17, "3.2319" should read -- 3.23/9 --.

Claim 5, col. 12, line 17, "5.5019" should read -- 5.50/9 --.

Claim 6, col. 12, line 24, "TGA" should read -- LTGA --.

Claim 9, col. 12, line 35, "1×10 Ω·cm" should read -- $1 \times 10^9$ Ω·cm --.

Signed and Sealed this
Twenty-third Day of February, 2016

Michelle K. Lee
*Director of the United States Patent and Trademark Office*